United States Patent

[11] 3,620,736

[72] Inventor Raife G. Tarkington
Rochester, N.Y.

[21] Appl. No. 863,719
[22] Filed Oct. 3, 1969
[45] Patented Nov. 16, 1971

[73] Assignee Eastman Kodak Company
Rochester, N.Y.

[54] PHOTOFABRICATION SYSTEM USING DEVELOPED NEGATIVE AND POSITIVE IMAGES IN COMBINATION WITH NEGATIVE-WORKING AND POSITIVE-WORKING PHOTORESIST COMPOSITIONS TO PRODUCE RESISTS ON OPPOSITE SIDES OF A WORKPIECE
12 Claims, No Drawings

[52] U.S. Cl. .......... 96/36, 96/36.2, 96/36.4, 96/38.3, 96/29 R
[51] Int. Cl. .......... G03c 5/00, G03c 5/54
[50] Field of Search .......... 96/36, 36.2, 36.4, 38.3, 29 R, 44

[56] References Cited

UNITED STATES PATENTS

| | | | |
|---|---|---|---|
| 3,156,563 | 11/1964 | Harrison et al. | 96/36 |
| 3,159,486 | 12/1964 | Henderson | 96/36.2 |
| 3,169,063 | 2/1965 | Johnston et al. | 96/36.2 X |
| 3,179,517 | 4/1965 | Tregillus et al. | 96/29 |
| 3,264,105 | 8/1966 | Houtz | 96/36.2 |
| 3,384,957 | 5/1968 | Shannon | 96/36.2 X |
| 2,179,786 | 11/1939 | Hardy | 96/5 |
| 2,218,229 | 10/1940 | Carroll et al. | 96/5 |
| 2,221,025 | 11/1940 | MacAdams et al. | 96/5 |
| 2,336,380 | 12/1943 | Wilmanns | 96/5 |
| 2,413,468 | 12/1946 | Rackett | 96/5 |
| 2,455,849 | 12/1948 | Yule | 96/69 X |

*Primary Examiner*—John T. Goolkasian
*Assistant Examiner*—Joseph C. Gil
*Attorneys*—William H. J. Kline, James R. Frederick and Joshua G. Levitt

ABSTRACT: Image layers bearing developed negative and positive images, are employed in combination with negative-working and positive-working photoresist compositions to produce resists on opposite sides of a workpiece.

PHOTOFABRICATION SYSTEM USING DEVELOPED NEGATIVE AND POSITIVE IMAGES IN COMBINATION WITH NEGATIVE-WORKING AND POSITIVE-WORKING PHOTORESIST COMPOSITIONS TO PRODUCE RESISTS ON OPPOSITE SIDES OF A WORKPIECE

This invention relates to a photographic process. More particularly, this invention relates to a photofabrication process employing photographically produced positive and negative photoelements.

In recent years, there has been an increasing emphasis placed on miniaturization in the production of printed circuits, the formation of parts from thin sheet metal, the production of fine mesh screens, reticules and the like. Improvements and refinements in metal resist and etching procedures have given rise to extensive use of photofabrication techniques. Such techniques involve the use of light-sensitive photoresists which are placed on metal surfaces to protect desired areas from the action of etching solvents. In this manner, chemical action replaces mechanical cutting in the preparation of parts. Thus, precise, highly detailed parts and articles may be simply and conveniently prepared through the use of photography and photosensitive resists. Designs and parts can be made, and excess metal can be removed without creating distortion, strains or points of weakness.

Photoetching is a photofabrication process that is concerned with the production of very fine patterns and involves a relatively small amount of material removal. The tolerances obtainable in photoetching are very exact and, thus, it is widely used in the production of printed circuits and the like.

In some applications, it is necessary to apply a resist image to opposite sides of a workpiece. In such instances the photographic steps of forming the image must be carried out with a great deal of precision. If a single negative or positive image is used, in order to preserve the correct orientation of the image, it is necessary that one of the exposures be with the base of the image carrier in contact with the resist composition. However, exposure with the base of the image carrier in contact with the photosensitive surface causes unsharpness of the edges of the image. It would be highly desirable and convenient to have a procedure whereby correctly oriented image layers could be directly employed in a surface to surface contact with opposite sides of a resist coated article and thereby avoid the need to expose one of the image layers with its base in contact with the photoresist.

Accordingly, it is an object of the present invention to provide a photofabrication system in which image layers are utilized in surface to surface contact with the opposite sides of a resist coated workpiece.

It is a further object of this invention to provide a process for the preparation of photoresist images on opposite sides of a workpiece in which image layers are placed in surface to surface contact with photoresist composition carried on opposite sides of said workpiece.

It is a further object of this invention to provide an article for use in photofabrication which has a novel combination of photoresist compositions coated on opposite sides thereof.

The above and other objects of this invention will become apparent to those skilled in the art from the further description of this invention which follows.

These and other objects of the present invention are attained by a process which comprises:

A. providing a first image layer having thereon a positive image of a pattern and a second image layer having thereon a negative image of said pattern, said positive and negative images being opaque to the exposing radiation;

B. providing a workpiece bearing a positive-working photoresist composition on one surface thereof and a negative-working photoresist composition on a surface opposite said one surface;

C. placing said first image layer in contact with one of said photoresist compositions and placing said second image layer in contact with the other of said photoresist compositions;

D. exposing each of said positive-working and negative-working photoresist compositions to actinic radiation through the image layers with which they are in contact; and E. developing a pattern of photoresist compositions on said workpiece by removing photoresist composition from nonimage areas of said two surfaces.

After development the workpiece is generally chemically etched in the areas from which the photoresist compositions have been removed to produce the desired article and the photoresist is removed by procedures common in the art.

In the foregoing manner, a complete matching of the images is possible because the exposures can be made on each surface with the image layer in contact with the photoresist. Thus, there is no need to expose the workpiece with the image layer being separated from the photoresist layer by the thickness of its support, as is the case when a single negative or positive image layer is employed for exposing both sides of the workpiece. If the required negative and positive image layers for use in conjunction with positive and negative working photoresists in preparation of resists on opposite sides of a workpiece are substantially simultaneously produced in a manner hereinafter more particularly described, the registration problems involved in aligning the image layers on either side of the workpiece heretofore encountered are substantially eliminated.

While various processes are available for obtaining positive and negative images of a pattern, in a preferred embodiment of this invention, the positive and negative image layers are produced substantially simultaneously while in contact by the procedure described in Tregillus et al. U.S. Pat. No. 3,179,517, issued Apr. 20, 1965, which involves processing a silver halide emulsion layer containing a latent photographic image of the desired pattern in intimate contact with a hydrophilic organic colloid processing element or web, having a silver precipitating agent and a processing solution contained therein. The emulsion layer and the processing element are maintained in contact for a period of time sufficient to develop the latent image and until the undeveloped silver halide has been cleared from the emulsion layer and precipitated in the processing element after which they are separated. Prior to separation it is desirable to punch registration holes or otherwise mark the two layers to aid alignment of the two images on the workpiece. In this manner, the silver halide emulsion layer becomes the negative image layer while the processing element becomes the positive image layer. Thus, the processing element and the emulsion layer become invested with a positive image and a negative image, respectively, of the desired pattern at substantially the same instant.

The processing element contains dispersed silver precipitating agent, and at least at the time of contact with the exposed emulsion layer, sufficient processing solution to develop the exposed silver halide and to remove substantially all of the undeveloped silver halide from the emulsion layer. The processing solution contains a silver halide developing agent and an organic amine-sulphur dioxide addition product, and a silver halide solvent or fixing agent.

The processing element is maintained in intimate contact with the silver halide emulsion layer until development of the latent image is substantially complete and substantially all of the undeveloped silver halide has been cleared from the emulsion layer by the silver halide solvent and becomes deposited in the processing element by the silver halide precipitating agent, thereby investing the processing element with the corresponding positive image.

While the emulsion layer and the processing element are maintained in contact for the desired length of time, they can be provided with holes or other means to assist in realignment. The employment of registration holes for alignment purposes is widely used in the graphic arts. The processing element is separated from the substantially completely developed and fixed negative image emulsion layer which requires no further processing of any kind, either washing or stabilization, for usual photographic purposes. However, it is sometimes desirable to employ a short water wash.

This process is more fully described in U.S. Pat. No. 3,179,517, to Tregillus et al., which patent is hereby incorporated by reference.

The positive image layer, which comprises the processing element may take any suitable form or shape. For example, it may consist of a pad, sheet, strip or web of hydrophilic material either unsupported or coated on a suitable support such as glass, metal, paper, polyethylene, polypropylene, polystyrene, polyethylene terephthalate, cellulose esters such as cellulose acetate, or the like. Transparent supports must be employed if the image layer is maintained on the support while the resist is exposed through it. It the support is removed from the image layer prior to exposure then opaque supports can be used as well.

Suitable hydrophilic organic colloids for the processing element include gelatin, cellophane, polyvinyl alcohol, hydrolyzed cellulose acetate, cellulose ether phthalate, carboxylated rubber, and similar materials. Particularly useful hydrophilic materials are gelatin and a copolymer made up of 80 percent acrylic acid and 20 percent ethyl acrylate.

The silver precipitating agents incorporated in the hydrophilic colloid layer of the processing element may be physical development nuclei or chemical precipitants including (a) heavy metals, especially in colloidal form, and the salts of these metals, (b) salts, the anions of which form a silver salt less soluble than the silver halide of the photographic emulsion to be processed, or (c) nondiffusing polymeric materials with functional groups capable of combining with an insolubilizing silver ion.

Suitable silver precipitating agents include sulfides, selenides, polysulfides, polyselenides, thiourea and its derivatives, mercaptans, stannous halides, silver, gold, platinum, palladium, and mercury, colloidal sulfur, aminoguanidine sulfate, aminoguanidine carbonate, arsenous oxide, sodium stannite, substituted hydrazines, xanthates, and the like. Polyvinyl mercaptoacetate is an example of a nondiffusing polymeric silver precipitant. Heavy metal sulfides such as lead, silver, zinc, nickel, antimony, cadmium, and bismuth sulfides are useful, particularly the sulfides of lead and zinc alone or in admixture, or complex salts of these with thioacetamide, dithiooxamide, or dithiobiuret. The heavy metals and the noble metals particularly in colloidal form are especially effective.

The processing solutions for the processing element comprise one or more silver halide developing agents, a silver halide solvent, an amine-sulfur dioxide addition product and water. Certain other ingredients may also be present.

The silver halide developing agents which may be employed in the processing solutions include methyl-p-amino-phenol sulfate hydroquinone, chlorohydroquinone, diaminophenols, e.g., 2,4-diaminophenol and 3,4-diaminophenol hydrochloride, glycine, 1-phenyl-3-pyrazolidone and its derivatives, triaminophenols, including 2,4,6-triaminophenol, catechol, pyrogallol, gallic acid, paraphenylene diamines, enediols, such as ascorbic acid, and combinations of these developing agents. Especially useful developing compositions comprise mixtures of monomethyl-p-aminophenol sulfate and hydroquinone: 1-phenyl-3-pyrazolidone and hydroquinone; and especially 4,4-dimethyl-1-phenyl-3-pyrazolidone and hydroquinone.

The amine-sulfur dioxide addition products may be added to processing solutions to provide efficient preservative and buffering action. The amine-sulfur dioxide addition products are prepared by reacting a suitable amine with sulfur dioxide gas. Amines suitable for this preparation include primary, secondary, and tertiary amines such as 2-aminoethanol, 2-methyl-aminoethanol, 2-dimethylaminoethanol, 2-ethylaminoethanol, 2-diethylaminoethanol, 2,2 ',2 ''-nitrilotriethanol, 2-aminoethyl-aminoethanol, 2,2'-iminodiethanol, 5-diethylamino-2-pentanol, 2-amino-2-methyl-1-propanol, morpholine, and piperidine, among others. The preferred amine-sulfur-dioxide addition product is prepared in the following manner. Sulfur dioxide gas is slowly bubbled through one mole of the preferred amine, 2,2'-iminodiethanol, with adequate stirring until it absorbs the equivalent of 0.25 mole of sulfur dioxide. The resulting 2,2'-iminoethanol-sulfur dioxide addition product contains the equivalent of 13 percent sulfur dioxide by weight, or 20 mole percent. When this amine-sulfur dioxide product is incorporated in typical processing solutions, a pH from 9.0–9.5 is obtained.

Although any of the well-known silver halide solvents, e.g., alkali thiocyanates, alkali selenocyanates, thioglycerol, aminoethanethiols, $\beta,\beta'$-dithiasuberic acid, etc., may be employed as a fixing agent in the processing solution, the preferred solvent is hypo, sodium thiosulfate pentahydrate. The concentration of this reagent in the processing solution may range from 2to about 25 grams per liter with advantage. In most cases, for example, it has been found that about 8 grams per liter of sodium thiosulfate pentahydrate provides satisfactory clearing of undeveloped silver halide with acrylic acid-ethyl acrylate copolymer processing elements whereas about 6 grams per liter is sufficient with gelatin processing elements.

The processing operation is carried out at ambient or slightly elevated temperatures. For example, up to about 85° F., the temperature not being particularly critical. The rate of negative image development with processing solutions of the type described above is rapid, it having been observed that a significant degree of development takes place within 10 seconds and that maximum contrast is usually achieved after about 20 seconds. Development is essentially complete within 1 minute. Clearing of the undeveloped silver halide from the silver halide emulsion is essentially complete at the end of 4 minutes in most instances. Therefore, processing times of from about 4 to 10 minutes are generally sufficient. However, since the processing reaction goes to completion, no harm is done in leaving the negative in contact with the processing element for even a period of hours, providing that loss of moisture which might cause the two sheets to become cemented together, does not occur.

This process is generally applicable to the processing of photographic emulsions of the developing-out type. Various silver salts may be used as the sensitive salt such as silver bromide, silver iodide, silver chloride, or mixed silver halides such as silver chlorobromide or silver bromoiodide. The emulsions are formulated according to known procedures and may include any of the usual addenda such as sensitizers, antifoggants, hardeners and the like. It can also be employed to process silver salt-sensitized emulsion layers containing incorporated developing agent. In such substances the silver halide developing agent is omitted from the processing solution since it is already present in the emulsion layer, all other steps of the process being carried out as with the usual developing agent-containing processing solutions and elements. In selecting a support on which to coat the emulsion, the same considerations apply as in selecting a support for the processing element.

As previously mentioned, the workpiece is provided with a coating comprising a positive-working photoresist on one surface and a negative-working photoresist on an opposite surface. The term "workpiece" as employed herein is intended to include any substrate having at least two opposite surfaces regardless of its specific shape or composition. Examples of such substrates include articles commonly employed in the production of printed circuits, fine mesh screens, reticules, and the like, and include sheets and foils of such metals as aluminum, copper, magnesium, zinc, etc.; glass and glass coated with such metals as chromium, chromium alloys, steel, silver, gold, platinum, etc., synthetic polymeric materials uncoated or coated with the above metals; and the like.

Any suitable negative-working photoresist composition may be employed for the coating of the surface of the workpiece to which the image layer carrying the negative image thereon is to be contacted so long as the photoresists obtained therewith are not adversely affected by the processing solutions employed with the positive-working photoresist composition. Such compositions are well known to the art and are readily available. Examples of suitable negative-working photoresist compositions include coating composition comprising aryl azides, such as azidostyryl ketones and azidostyrylaryl azides and the like in combination with organic solvent-soluble colloid materials, such as natural, synthetic, cyclized and oxidized rubbers. Suitable aryl azides include, for example, 4,4'-diazidostilbene; p-phenylene-bis(azide); p-azidobenzophenone; 4,4'-diazidobenzo-phenone; 4,4'-diazidodiphenylmethane, 4,4'-diazidochalcone, 2,6-di-(4-azidobenzal)cyclohexanone, 2,6-di-(4-azidobenzal)-4-methyl-cyclohexanone, and the like. Light-sensitive negative-working photoresist compositions of this general nature are disclosed in Hepher et al. U.S. Pat. No. 2,852,379, and Sagura et al. U.S. Pat. No. 2,940,853.

Other suitable negative-working photoresist compositions include, for example, the cinnamic acid esters of hydroxyl containing polymer such as polyvinyl alcohol, starch, cellulose, partially alkylated cellulose and the like. Such materials may be photosensitized with light-sensitizing agents, such as, for example, 6-nitrobenzothiazole; 2-methyl-6-nitrobenzothiazole; 2,3-dimethyl-6-nitrobenzothiazolium-p-toluene sulfonate; 2(2-anilinopropenyl)-β-naphthothiazole ethiodide; 2-methyl-x-nitro-β-naphthothiazole. Such negative-working photoresist compositions are disclosed in Minsk et al. U.S. Pat. No. 2,690.966, Minsk U.S. Pat. No. 2,725,372, Robertson et al. U.S. Pat. No. 2,732,301, and Sorkin U.S. Pat. No. 3,387,976.

Still further suitable negative-working photoresist materials include light-sensitive polyesters derived from (2-propenylidene)malonic compounds, such as cinnamylidene malonic acid, and bifunctional glycols. Such photoresist compositions are more fully described in Michiels et al. U.S. Pat. No. 2,965,878, and Clement et al. U.S. Pat. No. 3,173,787.

The positive-working photoresist compositions which are employed in the present invention can be selected from photoresist compositions known in the art. Suitable positive-working photoresists are based on diazo ketones or quinone diazides. A preferred positive-working photoresist composition comprises a film-forming resin in combination with an azonia diazo ketone as described in Belgian Pat. No. 711,951, which azonia diazo ketones have the formula:

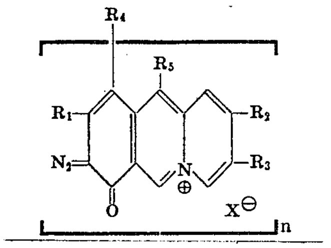

wherein X represents an anion such as, for example, a halide ion, a perchlorate ion, a tetrafluoroborate ion, etc.; *n* is a whole integer 1 or 2; each $R_2$ and $R_3$ is selected from the group consisting of hydrogen atoms, straight or branched chain alkyl groups having 1 to 8 carbon atoms, for example, methyl, ethyl, isopentyl, etc., aryl groups such as, for example, phenyl, naphthyl, etc., aralkyl groups such as, for example, benzyl, etc., cycloalkyl groups such as, for example, cyclopentyl, cyclohexyl, etc., and alkoxy groups having 1 to 4 carbon atoms, for example, methoxy, etc., said alkyl, aryl, aralkyl and cycloalkyl groups optionally containing hetero atoms, such as, for example, nitrogen, oxygen, sulfur, etc., and said alkyl, aryl, aralkyl and cycloalkyl groups being optionally substituted with halogen atoms, lower alkyl, aryl, nitro, sulfonic acid, hydroxy, carboxy, amido, carbalkoxy, e.g., carbethoxy, etc., alkoxy, e.g. methoxy, etc.; alkylamido, e.g., N-ethylamido, etc., dialkylamido, e.g., N,N-diethylamido, etc., and dialkylamino, e.g., N,N-diethylamino, etc., groups wherein each alkyl portion of said carbalkoxy, alkoxy, alkylamido, dialkylamido and dialkylamino groups contains 1 to 4 carbon atoms and $R_2$ and $R_3$ may be taken together to represent the atoms necessary to complete a fused aromatic mono- or polycyclic ring system, said cyclic ring system being optionally substituted with any of the group specified for $R_2$ and $R_3$ taken separately, $R_1$ is selected from the group consisting of halogen atoms, nitro, sulfonic acid, carboxy, amido, carbalkoxy, alkoxy, alkylamido, dialkylamido, dialkylamino and the groups specified for $R_2$ and $R_3$ when $R_2$ and $R_3$ are taken separately, each alkyl portion of said carbalkoxy, alkoxy, alkylamido, dialkylamido, and dialkylamino groups containing 1 to 4 carbon atoms; $R_5$ is selected from the group consisting of hydrogen atoms, alkyl groups of 1 to 4 carbon atoms, and substituted or unsubstituted phenyl groups such as, for example, tolyl, halophenyl, nitrophenyl, etc.; $R_4$, when *n* is 1, is selected from the group specified for $R_1$, and $R_4$, when *n* is 2, is an alkylene chain of 1 to 4 carbon atoms, e.g., methylene, etc., or a chemical bond.

Other suitable positive acting photoresist compositions include light-sensitive polymers to which is appended quinone diazide units. Such polymers may be prepared by the reaction of a monomer or polymer containing a free reactive nitrogen atom or hydroxyl group with a quinone diazide such as an acid ester of quinone diazide such as are described in Schmidt et al. U.S. Pat. No. 3,046,120, and Belgian Pat. No. 723,556. When the monomer is used, it may be subsequently polymerized by conventional methods. The polymeric quinone diazides may be dissolved in an organic solvent and applied as a solution to a support. The dried coating may be exposed to a light image to decompose the diazo structure in the light struck areas, as represented by the following reaction:

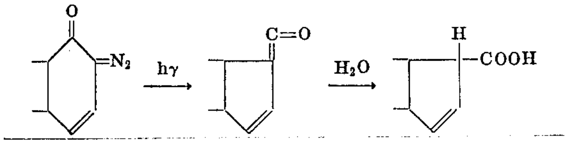

After exposure, the coating is developed to produced a useful image. For the production of a positive-working system, the coating may be imbibed with a dilute alkali solution which dissolves the alkali soluble material formed by the decomposition as a result of exposure. Thus, the exposed areas are washed away leaving a positive image of undecomposed light-sensitive polymer from a positive original.

Film-forming polymeric compounds having units of the following general structure are especially suitable for the preparation of positive acting light-sensitive layers $$-\overset{\displaystyle R}{\overset{|}{N}}-X-D$$

wherein R is hydrogen or lower alkyl such as e.g., alkyl having 1–4 carbon atoms, X represents a sulfonyl (—$SO_2$—), carbonyl (—CO—), carbonyloxy $\left(\begin{matrix}O\\ \|\\ -C\,O-\end{matrix}\right)$, sulfinyloxy $\left(\begin{matrix}O\\ \|\\ -S\,O-\end{matrix}\right)$ group, etc., and D represents a quinone diazide group.

Polymeric units attached to the above $$-\overset{\displaystyle R}{\overset{|}{N}}-X-D$$

units include homo or copolymers which may be condensation or addition polymers, natural or synthetic types and mixtures thereof.

Addition-type polymers suitable for preparing positive-acting polymers are those containing a reactive nitrogen and include aminostyrenes, polyvinyl amines, polyaminoalkyl acrylamides, aniline substituted polyacrylic acid amides, polyvinyl anthranilates as well as amino containing heterocyclic nuclei polymers such as polymeric amino triazoles.

Condensation-type polymers having a free reactive nitrogen suitable for use in preparing positive-acting polymers include aniline formaldehyde type polymers wherein aniline and formaldehyde are condensed under strong acid conditions as described on page 280 of Golding, B., "Polymers and Resins," D. Van Nostrand, New York, 1959.

Gelatin represents one natural polymer having reactive nitrogen atoms suitable for preparing positive-acting polymers. Other proteins may also be used such as casein, zein, etc.

Additionally, positive-acting photoresist composition can be prepared by combining at least one of the positive-working light-sensitive materials with a different film-forming resin. For instance, the film-forming resin may be a phenol-formaldehyde resin such as those known as novolac or resole resins ("Hackh's Chemical Dictionary " by Grant, 3rd edition, 1944, McGraw-Hill, New York, N.Y.). In a particularly useful embodiment, the weight ratio of light-sensitive material to resin is in the range of about 1:1.5 to about 1:20 and results in especially good performance at a weight ratio of about 1:5 to about 1:10.

The positive and negative photoresist compositions are applied to the cleaned, dried workpiece by techniques conventional in the art such as spray coating, whirl coating, roller coating and the like. If desired the resist composition can be given a prebake of 10 to 15 minutes at about 60° C. to remove residual solvent.

The light source used to expose the resist compositions and the length of exposure will vary with the particular resist compositions employed as well as other factors, although the light source will generally be one which is rich in ultraviolet radiation. Suitable light sources include carbon arc lamps, mercury vapor lamps, fluorescent lamps, tungsten filament lamps, and the like.

The exposed resists are developed by removing resist composition from nonimage areas of the workpiece. This can generally be accomplished by treatment with a material which is a solvent for the resist composition in nonimage areas but is a nonsolvent for the resist composition in image areas. For the negative-working resists the developing solvents are generally organic solvents such as trichloroethylene, toluene and the like. Minsk et al. U.S. Pat. No. 2,670,286, describes useful organic solvents from which developing solvents for the negative-working photoresist compositions can be selected. The developing solvents used with the positive-working photoresist compositions are generally aqueous alkaline solutions, although with some positive photoresist composition organic solvents can be used to effect development. The alkaline strength of developer can range up to that of 5 percent aqueous sodium hydroxide. The developer may also contain dyes and/or pigments and hardening agents. The developed image may be rinsed with distilled water, dried and optionally postbaked for 15 to 30 minutes at 60° to 80° C.

Thus, summarily, in a preferred embodiment of this invention a silver halide emulsion is exposed to the desired design pattern and is placed in intimate contact with a nucleated processing element in order to provide a negative image layer upon the exposed element and a positive image layer upon the processing element, the negative and the processing element are provided with registration holes while in contact and prior to separation. Next, they are separated, washed and dried. Thereafter, a work piece, e.g., a copper plate, is provided with a negative-working photoresist on one surface and a positive-working photoresist coating on an opposite surface. The developed negative element is placed in contact with the workpiece with the image layer in face-to-face contact with one of the photoresist compositions. In the preferred embodiment the negative image is placed in contact with the negative-working resist and the positive image is placed in contact with the positive-working resist. However, it is possible, and in some instances may be desirable, to employ the opposite arrangement of image layer and photoresist composition.

The negative image is aligned with the workpiece. Registration pins may be employed to position the image precisely prior to exposure. However, any suitable registration apparatus may be employed for assisting in the alignment of the image-carrying elements with the workpiece. The provision of registration holes in the image-carrying elements as previously indicated makes alignment of these elements a relatively simple matter.

The workpiece, with the negative image on one side, is exposed and developed with removal of the nonimage portions of the photoresist. The positive image layer is then placed in face-to-face contact with the positive-working photoresist composition on the opposite side of the workpiece and the positive image is aligned with the developed resist on the opposite side using, e.g., registration pins. The positive image side of the workpiece is then exposed and developed with removal of the exposed portions of the photoresist.

Development may be followed by a water rinse and drying, for example, by an airjet. Finally, the workpiece is etched from both sides in a suitable etching solution, such as a ferric chloride solution. The resist image protects the pattern areas on both sides of the workpiece while the unprotected areas are etched away leaving the desired pattern.

In the foregoing manner, a photofabrication process is provided which may be especially useful in a production of articles having a precise relationship between images on both sides of the article to be formed.

The following examples further illustrate this invention.

EXAMPLE 1: PREPARATION OF POSITIVE AND NEGATIVE IMAGES

A sheet of ortho high-contrast negative film comprising a gelatin-silver chlorobromide emulsion coated on cellulose acetate is exposed to an intricate, fine detailed design which includes a number of very fine lines, holes, slots and areas for contact terminals. The exposed film is processed by rolling it into intimate contact with a nucleated processing element. The processing element comprises a cellulose acetate film support having coated thereon silver sulfide nuclei dispersed in gelatin at a concentration of 2,000 milligrams per square foot. The processing element has been soaked in a solution having the composition of table 1, below for a period of 5 minutes.

TABLE 1

| Ingredient | Concentration (grams) |
|---|---|
| 4,4-dimethyl-1-phenyl-3-pyrazolidone | 1.0 |
| Hydroquinone | 10.0 |
| 2,2′-iminodiethanol-$SO_2$-addition product (20 mole percent $SO_2$) | 190.0 |
| 2,2′-iminodiethanol | 50.0 |
| Sodium thiosulfate, pentahydrate | 8.0 |
| Water to make 1.0 liter. | |

After the processing element and exposed film are in contact for a period of 5 minutes at a temperature of 75° F., they are punched with registration holes to assist in the later realignment of the images. The resulting positive image-carrying processing element and the developed negative image-carrying film are washed and dried. The negative image has a $D_{max}$ of 1.8 while the positive image has a $D_{max}$ of 2.4.

The following example illustrates the preparation of intricate copper parts by chemically etching employing resist patterns exposed through the images prepared in the manner illustrated by example 1.

EXAMPLE 2

A copper sheet having a thickness of 0.010 mil is cleaned in a solution comprising 15 percent phosphoric acid and 15 percent sulfuric acid in a 1:1 ratio. The cleaning operation is conducted at room temperature and for a period of 5 minutes. The copper sheet is then washed with water and is dried and coated on one surface thereof with a solution of a negative-working photoresist composition. A solution of sensitized polyvinyl cinnamate is whirler-coated at 80 r.p.m. to produce a coating having a thickness of 0.09 millimeter. The coated sheet is then prebaked at a temperature of 80° C. for a period of 10 minutes in order to promote drying. Next, the opposite side of the copper sheet is coated with a positive-working resist composition having the formulation:

| | |
|---|---|
| 8-phenyl-6-diazo-5-oxo-4a-azonia-anthracene fluoroborate | 1.8 grams. |
| 4-butyrolactone | 45.0 ml. |
| 2-ethoxyethanol | 80.0 ml. |
| Cresol-formaldehyde resin (Alnovol 429K) | 21.6 grams. |

The solution is filtered, flow coated on a clean copper surface, and air dried for 10 minutes at 60° C. The negative image-carrying film prepared as described in example 1 is placed in intimate contact with the negative-working photoresist, employing registration pins to position the image precisely for exposure. Next, the negative-working photoresist side of the sheet is exposed through the negative image. The plate is then developed for a period of 2 minutes in a trichloroethylene vapor degreaser in order to remove the unexposed areas. Next, it is rinsed in water and dried. The copper sheet, with a developed resist image on one side and a light-sensitive positive-working resist on the opposite side, is positioned with the positive image-carrying element prepared as described in example 1 in intimate contact with the positive-working resist and in precise alignment with the developed resist on the opposite side of the copper sheet employing the registration holes. The copper sheet is further exposed for a period of 5 minutes at an intensity of 2,000 foot-candles employing a carbon arc source. The exposure is directed through the transparent support of the positive element with the image in direct contact with the positive-working resist as previously indicated. The photoresist on the plate is then developed in a trisodiumphosphate solution (15 percent concentration) for a period of 2 minutes to remove the exposed portion. The resist is rinsed with water and dried with a jet of air. The plate is then postbaked for 5 minutes at 60° C. Both sides of the copper plate are etched in a 42 percent $FeCl_3$ solution. The resist image protects the pattern areas on both sides of the sheet, while the unprotected areas are etched away leaving the intricate pattern of slots, holes and fine connections. Very fine detail can be etched in the copper sheet with only half the undercutting which takes place when an etch of comparable depth must be made from one side. Furthermore, the sharpness of the resist image is greater than can be accomplished by less direct methods due to making the exposure with the image in direct contact with the light-sensitive layer. Thus, the exposure of the photoresist is made using precise images in direct contact with the light-sensitive layer. The unsharpness encountered in prior methods is thereby eliminated.

EXAMPLE 3

When example 2 is repeated using as the negative-working photoresist an arylazide sensitized cyclized rubber composition and as the positive-working photoresist composition a mixture of a phenolic resin and a styrene-aminostyrene copolymer, reacted with a 1,2-naphthoquinone-2-diazide-5-sulfonyl chloride as described in example 5 of U.S. Ser. No. 684,636, filed Nov. 21, 1967 abandoned after refiling as U.S. application Ser. No. 72,896, on Sept. 16, 1970, similar results are obtained.

The invention has been described in detail with particular reference to preferred embodiments thereof, but it will be understood that variations and modifications can be effected within the spirit and scope of the invention.

What is claimed is:

1. A photofabrication process for producing a pattern on opposite sides of a workpiece, which comprises:
   - A. providing a first image layer having thereon a positive image of a pattern and a second image layer having thereon a negative image of said pattern, said positive and negative images being opaque to the exposing radiation;
   - B. providing a workpiece bearing a positive-working photoresist composition on one surface thereof and a negative-working photoresist composition on a surface opposite said one surface;
   - C. placing said first image layer in contact with one of said photoresist compositions and placing said second image layer in contact with the other of said photoresist compositions;
   - D. exposing each of said positive-working and negative-working photoresist compositions to actinic radiation through the image layers with which they are in contact;
   - E. developing a pattern of photoresist compositions on said workpiece by removing photoresist composition from nonimage areas of said two surfaces; and
   - F. chemically etching the areas of the workpiece from which photoresist compositions have been removed.

2. A process of claim 1, wherein the opposite photoresist-bearing surfaces of the workpiece are parallel.

3. A process of claim 1, wherein said first and second image layers are carried on transparent supports.

4. A process of claim 1, wherein said first, positive image layer is placed in contact with said positive-working photoresist composition and said second, negative image layer is placed in contact with said negative-working photoresist composition.

5. A process of claim 1 wherein the positive and negative image layers, are prepared substantially simultaneously by a process which comprises intimately contacting an exposed negative silver halide emulsion layer with a water-permeable hydrophilic organic colloid processing element separable from said emulsion layer and having dispersed therein a silver precipitating agent, said processing element containing an amount of processing solution sufficient to develop said exposed silver halide to metallic silver and to dissolve substantially all undeveloped silver halide from said exposed emulsion layer, maintaining said processing element and said emulsion layer in intimate contact until development of a latent image and until substantially all of the undeveloped silver halide has been cleared from said emulsion layer and precipitated in said processing element, providing registration holes in said silver halide emulsion layer and said processing element while said layer and said element are still in intimate contact, and separating said emulsion layer containing a negative silver image from said processing element containing a positive silver image.

6. A process of claim 1, wherein said negative-working resist is a cinnamic acid ester of a hydroxy-containing polymer.

7. A process of claim 1, wherein said negative-working resist is an azide sensitized rubber material.

8. A process of claim 1, wherein said negative-working resist is a poly(vinyl cinnamate).

9. A process of claim 1, wherein the positive-working resist is a mixture of an azonia diazo ketone and a phenolic resin.

10. A process of claim 1, wherein the positive-working resist is a polymeric quinone diazide.

11. A process of claim 1, wherein the workpiece is a metal plate.

12. A process of claim 1, wherein the workpiece is a copper plate.

* * * * *